(12) United States Patent
Davidson (10) Patent No.: US 9,533,499 B2
(45) Date of Patent: Jan. 3, 2017

(54) METHOD AND SYSTEM FOR MODIFYING A SURFACE TOPOGRAPHY

(71) Applicant: Hewlett-Packard Industrial Printing LTD, Netanya (IL)

(72) Inventor: Alex Davidson, Netanya (IL)

(73) Assignee: Hewlett-Packard Industrial Printing LTD., Netanya (IL)

( * ) Notice: Subject to any disclaimer, the term of this patent is extended or adjusted under 35 U.S.C. 154(b) by 360 days.

(21) Appl. No.: 14/038,041

(22) Filed: Sep. 26, 2013

(65) Prior Publication Data

US 2014/0087151 A1 Mar. 27, 2014

(30) Foreign Application Priority Data

Sep. 27, 2012 (EP) .................. 12186211.4

(51) Int. Cl.
| | |
|---|---|
| *B41J 2/07* | (2006.01) |
| *H05K 13/00* | (2006.01) |
| *B41J 11/00* | (2006.01) |
| *B41J 13/22* | (2006.01) |
| *B41J 3/407* | (2006.01) |

(52) U.S. Cl.
CPC *B41J 2/07* (2013.01); *B41J 3/407* (2013.01); *B41J 11/002* (2013.01); *B41J 11/0085* (2013.01); *B41J 13/226* (2013.01); *H05K 13/0069* (2013.01); *Y10T 428/24802* (2015.01)

(58) Field of Classification Search
CPC .............................. Y10T 428/24802
See application file for complete search history.

(56) References Cited

U.S. PATENT DOCUMENTS

| | | | |
|---|---|---|---|
| 6,357,869 B1 | 3/2002 | Rasmussen et al. | |
| 6,899,775 B2 * | 5/2005 | Hill .......................... | B41M 1/18 156/60 |
| 7,169,265 B1 | 1/2007 | Kramer et al. | |
| 2003/0035903 A1 * | 2/2003 | Yeh ........................ | C08L 63/00 427/558 |
| 2003/0038420 A1 | 2/2003 | Cleary et al. | |
| 2003/0051801 A1 | 3/2003 | Usami et al. | |
| 2005/0280184 A1 | 12/2005 | Sayers et al. | |
| 2008/0229943 A1 | 9/2008 | Barinaga | |

OTHER PUBLICATIONS

European Patent Office, Extended European Search Report, Mar. 11, 2013, 7 pgs.

\* cited by examiner

*Primary Examiner* — Gerard Higgins
(74) *Attorney, Agent, or Firm* — HP Inc. Patent Department (57) ABSTRACT

According to one example, there is provided a method or system for modifying the surface topography of a substrate support.

8 Claims, 6 Drawing Sheets

FIGURE 1

TO VACUUM PUMP          TO VACUUM PUMP

METHOD AND SYSTEM FOR MODIFYING A SURFACE TOPOGRAPHY

BACKGROUND

In various industries substrates are often required to be supported on substrate supports prior to processing operations being performed on the substrates. Examples of such industries are the printing industry, the semi-conductor manufacturing industry, and other sheet material manufacturing industries.

In the printing industry substrates are generally secured to a substrate support prior to printing being performed on the substrate. In industrial printing systems, substrates are often secured to a substrate support using a vacuum-based substrate support which has an arrangement of vacuum orifices in fluid communication with a vacuum pump.

Vacuum-based substrate supports are generally designed according to the characteristics of the substrates with which they are intended to be. For example, a substrate support intended to secure lightweight flexible substrates may have a small number of vacuum orifices distributed across the substrate support, whereas a substrate support intended to secure a heavier-weight rigid substrate may have a larger number of larger vacuum orifices distributed across the substrate support. The size of vacuum orifices may also be chosen based on the types of substrates intended to be used with the substrate support.

Where a mix of different substrates are to be secured, a general purpose substrate support may be designed that offers a compromise between the differing requirements. However, such designs often have shortcomings.

Furthermore, using substrates smaller than a substrate support creates problems in that when vacuum orifices are not covered by a substrate this results in a general loss of vacuum pressure, may lead to an increase in noise, and may have other undesirable consequences.

BRIEF DESCRIPTION

Examples, or embodiments, of the invention will now be described, by way of non-limiting example only, with reference to the accompanying drawings, in which.

DETAILED DESCRIPTION

Figure 1:
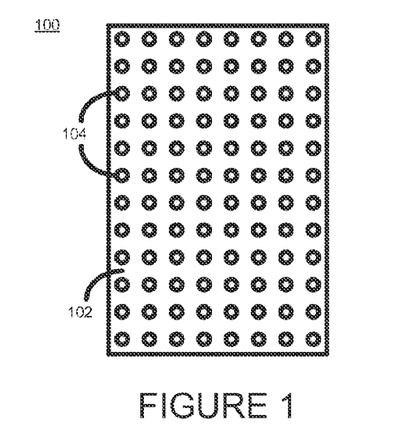
FIG. 1 is a plan view of a substrate support according to one example.

Referring now to FIG. 1, there shown an illustration of a substrate support 100. The substrate support 100 comprises a top surface 102 into which are incorporated an arrangement of vacuum orifices 104. The vacuum orifices 104 are in fluid communication with a vacuum pump (not shown). The vacuum pump sucks air from each of the vacuum orifices 104 such that a substrate placed on the substrate support 100 is secured to the substrate support 100 by way of the negative air pressure generated beneath the substrate in the region of each vacuum orifice 104.

The substrate support 100 is a flatbed substrate support, although the principles described herein also apply for drum-shaped and other shaped substrate supports.

For a given vacuum-based substrate support the number of vacuum orifices, the arrangement of the vacuum orifices, and the characteristics of the vacuum orifices are design considerations made when manufacturing a substrate support based on characteristics of the substrates intended to be used on the substrate support. As such, the design of a vacuum-based substrate support cannot be easily or cheaply modified after manufacture.

Problems can therefore arise when using substrates of different types on a given vacuum-based substrate support. For example, if vacuum orifices are made large enough to secure a heavy substrate, when using a flexible substrate it is possible that the force applied is sufficient to bend the substrate in the vicinity of the orifices. Similarly, if small orifices are used for use with light substrates, insufficient force may be applied to secure a heavier substrate.

In the printing industry, for example, even slight unintended movement of a substrate during a printing operation may result in reduced print quality.

Similarly, even a slight deformation of a substrate being printed on may result in reduced print quality.

Figure 2:
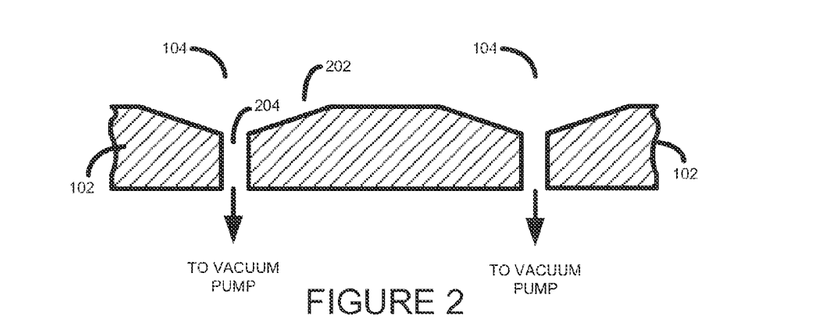
FIG. 2 is section view of a portion of a substrate support according to one example.
Figure 3:
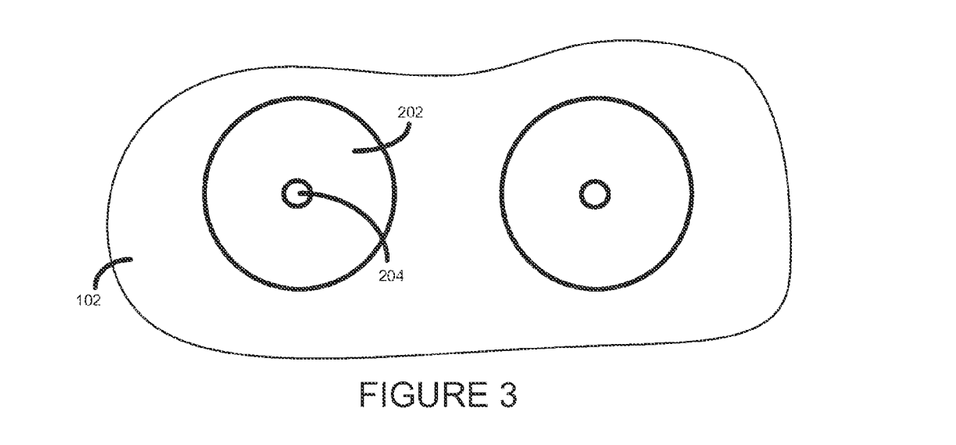
FIG. 3 is a plan view of a portion of a substrate support according to one example.

Referring now to FIG. 2 there is a shown a cross section of a portion of the substrate support 100 showing a pair of vacuum orifices 104 in greater detail. FIG. 3 is an illustration showing a corresponding plan view.

Each vacuum orifice comprises a channel 204 which is in fluid communication with a vacuum pump (not shown). The channel 204 opens into an orifice opening 202 recessed into the top surface of the substrate support 100. In the example shown the orifice opening 202 has a conical shape although other shapes could be used.

In some substrate supports different ones of the orifice openings may have different shaped orifice openings.

Figure 4:
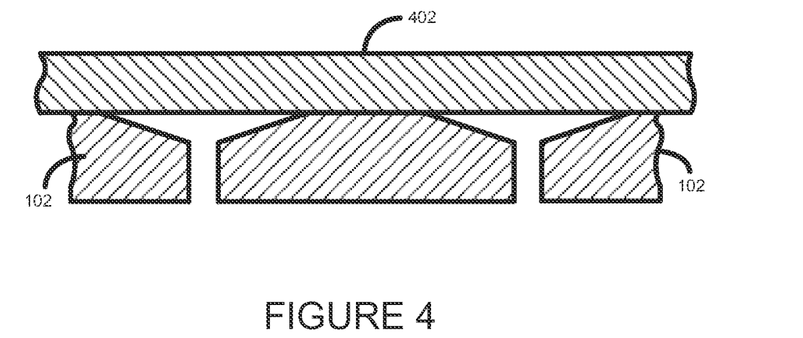
FIG. 4 is a section view of a portion of a substrate support on which a rigid substrate is disposed according to one example.
Figure 5:
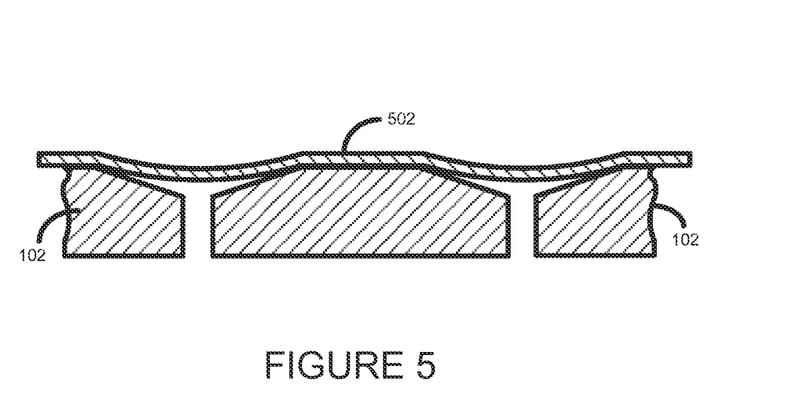
FIG. 5 is a section view of a portion of a substrate support on which a flexible substrate is disposed according to one example.

For a particular usage of the substrate support 100 the characteristics of the substrate support 100 may be deemed suitable. For example, the substrate support 100 may be designed for use with rigid substrates, such as substrate 402 illustrated in FIG. 4. However, as illustrated in FIG. 5, use of the same substrate support 100 with a flexible substrate 502 may result in the substrate 502 being deformed in the vicinity of the vacuum orifice openings.

As will be described in more detail below, examples described herein provide techniques that enable a substrate support having a given surface topography, or relief, to be modified to have a desired surface topography, or relief. The modification of the surface topography is achieved by printing one or more images directly on the substrate support. In one example each image defines a layer of ink to be printed.

Figure 6:
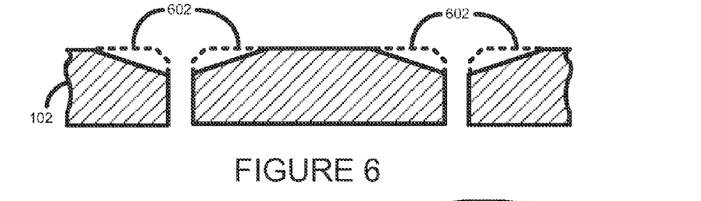
FIG. 6 is section view of a portion of a substrate support showing a desired topography according to one example.
Figure 7:
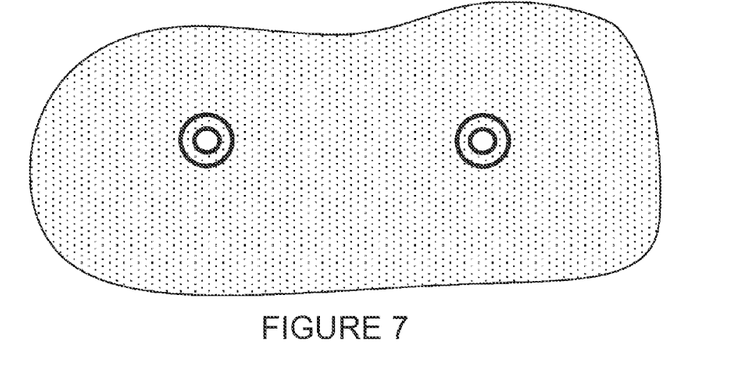
FIG. 7 is a plan view of a portion of a substrate support according to one example.

FIG. 6 shows a cross section view of a portion of the substrate support 100 and also shows the surface topography of the section according to one example. Also shown in FIG. 6 is a new desired surface topography 602. A corresponding plan view is illustrated in FIG. 7. In this example, the new desired surface topography reduces the size of the orifice openings, for example, making the substrate support 100 more suitable for use with flexible substrates.

Figure 8:
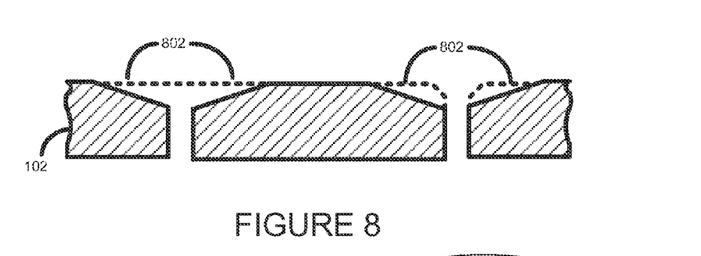
FIG. 8 is section view of a portion of a substrate support showing a desired topography according to one example.
Figure 9:
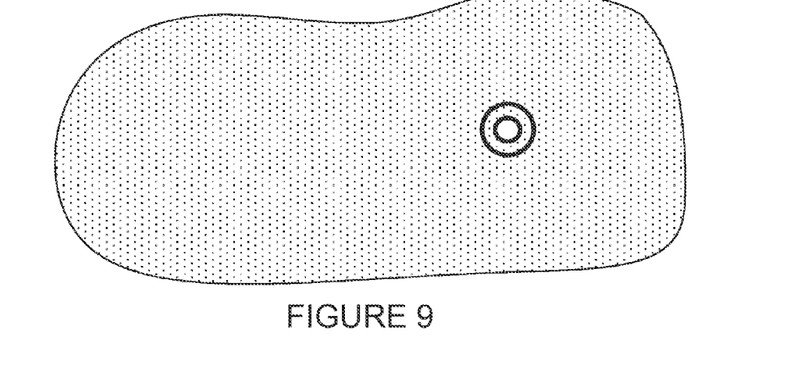
FIG. 9 is a plan view of a portion of a substrate support according to one example.

FIG. 8 shows a cross section view of a portion of the substrate support 100 and also shows the surface topography of the section according to one example. Also shown in FIG. 8 is a new desired surface topography 802. A corresponding plan view is illustrated in FIG. 9. In this example, the new desired surface topography reduces the size of the one of the orifice openings, and completely blocks another orifice opening.

Figure 10:
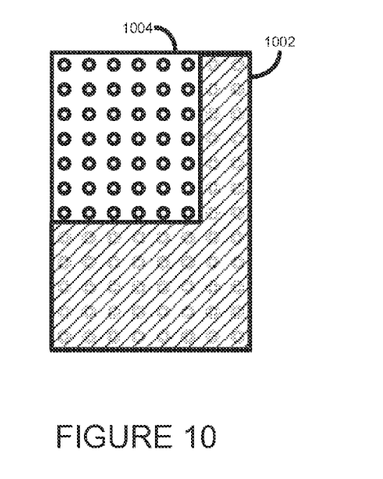
FIG. 10 is a plan view of a substrate support according to one example.

The blocking of orifice openings is useful when, for example, a substrate that is smaller than the size of the substrate support is intended to be used thereon, as illustrated in FIG. 10. FIG. 10 shows a plan view of a substrate support in which the desired surface topography has a first section 1002 in which vacuum openings are completely blocked, and a second section 1004 in which vacuum openings are not modified.

Figure 11:
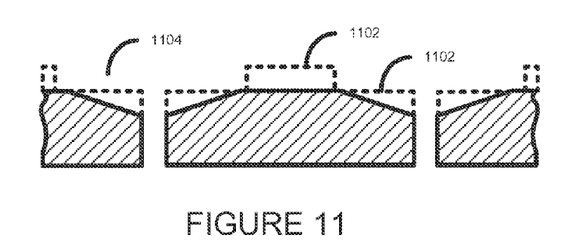
FIG. 11 is section view of a portion of a substrate support showing a desired topography according to one example.
Figure 12:
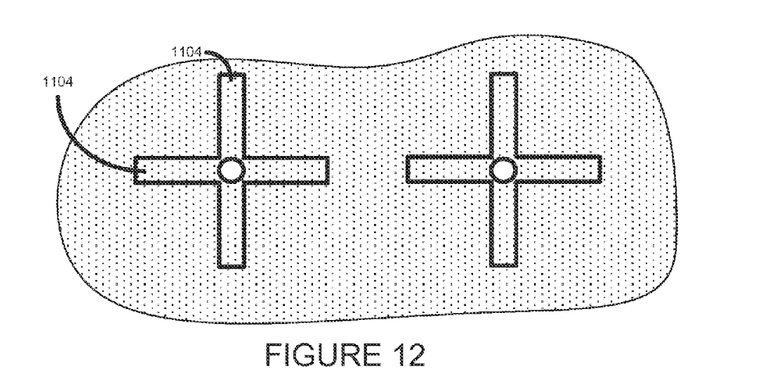
FIG. 12 is a plan view of a portion of a substrate support according to one example.

FIG. 11 shows a cross section view of a portion of the substrate support 100 and also shows the surface topography of the section according to one example. Also shown in FIG. 11 is a new desired surface topography 1102. A corresponding plan view is illustrated in FIG. 12. In this example, the new desired surface topography 1102 provides a number of surface channels 1104 in the vicinity of the vacuum channels 204. The size and shape of the surface channels can be chosen based on particular requirements.

Figure 13:
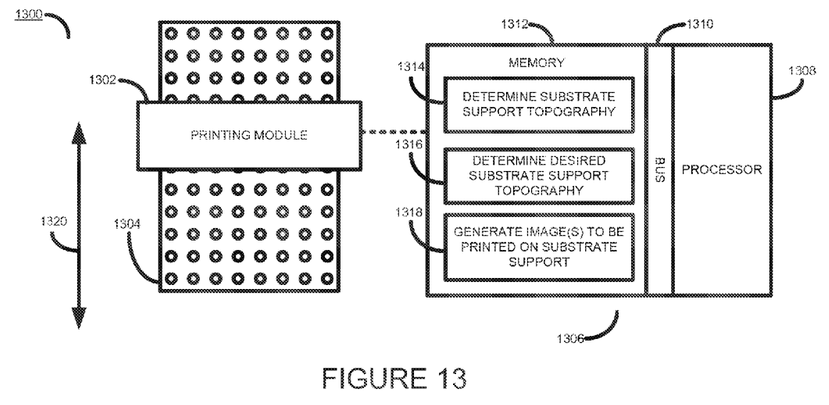
FIG. 13 is a block diagram showing an illustration of a printing system according to one example.

A printing system according to one example will now be described with reference to FIG. 13.

The printing system 1300 comprises a printing module 1302. The printing module 1302 comprises an inkjet printhead for ejecting ink drops on a substrate. Typically, the printing module 1302 is configured to eject ink drops on a substrate placed on a substrate support 1304.

Known printing systems are typically designed not to perform a printing operation when no substrate is placed on a substrate support, to avoid ink from damaging the substrate support or from making the substrate support dirty. Typically known printing systems include numerous safety mechanisms to prevent a printing module from printing when no substrate is loaded on a substrate support.

However, in the present examples, the printing system 1300 has a special operating mode that enables the printing module 1302 to eject ink drops on the substrate support 1304 even when no substrate is loaded thereon. The special operating mode is in addition to a regular operating mode that enables the printing module 1302 to eject ink drops on a substrate loaded on the substrate support 1304.

In one example the printing module 1302 comprises a carriage (not shown) on which is installable an inkjet printhead, such as a piezo printhead. In some examples multiple printheads are installable on the carriage. In one example the carriage scans across the width of the substrate support 1304, on a carriage bar, whilst ejecting ink drops in accordance with printhead control data generated by a printer controller 1306. In this way the printing module 1302 is able to print a swath of an image. Relative movement perpendicular to the carriage bar between the printing module 1302 and the substrate support 1304 enables the substrate to be moved under the printing module 1302 enabling further image swaths to be printed.

In one example the substrate support 1304 has a width of between 1 and 2 meters, and a length of between 2 to 3 meters. In other examples different sizes of substrate support 1304 may be used.

In another example, the printing module 1302 comprises a non-scanning print bar on which are installable multiple printheads arranged in a page-wide array configuration to span across the whole, or substantially the whole, width of the substrate support 1304. In this way the printing module 1302 may simultaneously eject ink drops across substantially the width of the substrate support 1304. Continuous relative movement perpendicular to the print bar between the printing module 1302 and the substrate support 1304 enables the substrate to be moved under the printing module 1302 to enable an image to be printed on the substrate.

In one example the printheads installable in the printing module 1302 eject ultra-violet (UV) curable fluid, such as ink or varnish, and the printing module 1302 additionally comprises one or multiple UV radiation sources, such as UV lamps, to cure or pin printed ink. In one example the UV curable fluid is cured within a short time delay of being ejected onto the substrate support. In one example the time delay may be in the range of about 0.1 to 10 seconds, although in other examples shorter or greater delays may be used.

As previously mentioned, operation of the printing system 1300 is controlled by the printer controller 1306. The controller 1306 comprises a processor 1308, such as a microprocessor, a micro controller, or the like.

The processor 1308 is coupled to a communication bus 1310 which allows communication between the processor 1308 and a memory 1312. The memory 1312 stores processor understandable instructions 1314 that, when executed by the processor 1308, enable the printing system to determine a surface topography of a substrate support. The memory 1312 also stores processor understandable instructions 1316 that, when executed by the processor 1308, enable the printing system to determine a desired substrate support surface topography. The memory 1312 also stores processor understandable instructions 1318 that, when executed by the processor 1308, enable the printing system to generate control data to print one or more images on the substrate support 1304.

Figure 14:
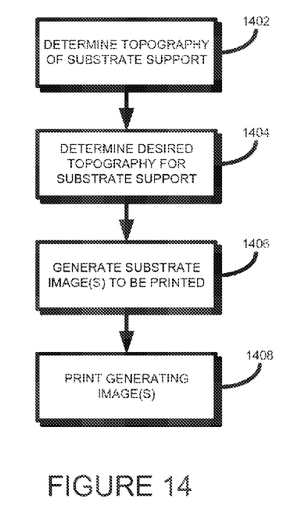
FIG. 14 is a flow diagram outlining an example method of operating a printing system according to one example.

A method of operating the printing system 1300, according to one example, is described below with additional reference to the flow diagram of FIG. 14. Prior to commencing operation the vacuum pump should be turned off.

At block 1402 the controller 1306 determines the three-dimensional surface topography of the substrate support 1304. In one example the surface topography is obtained from a data file, for example supplied by the manufacturer of the substrate support 1304. The data file may be, for example stored in the memory 1312, obtained from a remote server over a public network, be supplied on a physical memory support, or in any other suitable manner.

Figure 15:
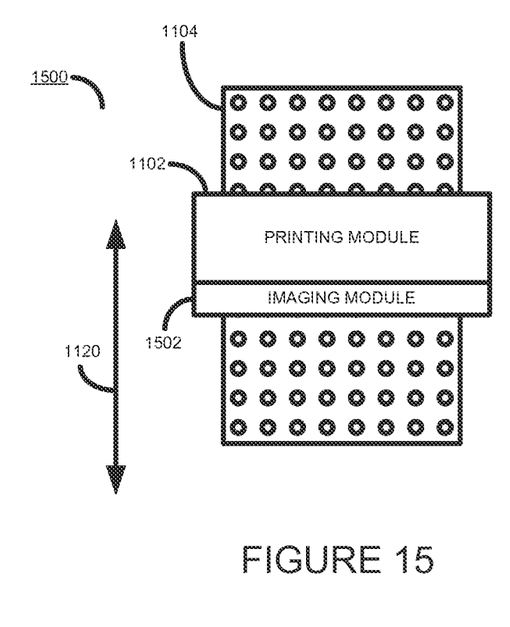
FIG. 15 is a block diagram showing an illustration of a printing system according to one example.

In another example, as shown in FIG. 15, the printing system 1500 additionally includes an imaging module 1502 that scans the surface of the substrate support 1304. In one example the imaging module 1502 includes a suitable visual scanner to record an accurate three-dimensional surface topography of the substrate support 1304. In other examples other types of surface scanners or imaging devices may be used.

At block 1404 the controller 1306 determines a desired surface topography of the substrate support 1304. The desired surface topography defines additional elements that may be added to the current topography of the substrate support 1304.

In one example, a desired topography is provided by a predetermined data file that may also be provided by the manufacturer of the substrate support table 1304, or by any third party. In other example the desired surface topography may be generated by a computer application that allows an operator to modify the determine substrate support surface topography in a desired manner.

Once the desired surface topography has been determined, at block 1406 the processor 1306 generates one or multiple images to be printed on the surface of the substrate support 1304. The generated image or images, when printed on the surface of the substrate support 1304 to modify the surface topography of the substrate support 1304 to have the desired surface topography.

Where the desired surface topography causes an orifice to be blocked, the ink causing the blockage should be suitable for resisting vacuum forces applied by the vacuum pump. For example, depending on the type of ink used, one or multiple layers of ink may need to be deposited to satisfactorily block an vacuum orifice.

The number of images generated depends in part on the type of ink used. For example, HP FB 225 UV curable ink each layer of cured ink has a thickness of about 100 microns (0.1 mm). Thus, by printing multiple images, multiple layers of ink can be printed and cured on the substrate support, thereby progressively building up the surface topography to the desired surface topography.

At block 1408 the controller 1306 controls the printing system to print and cure the generated images directly on the substrate support 1304.

In this way, the surface topography of a substrate support may be additively modified to a desired topography.

The substrate support with the desired topography may then be used for printing operations in the normal manner.

In one example black ink may be used to print the image or images on the substrate support. In other examples, however, other coloured inks could be used. In a further example the printing system may include an additional printhead for printing with a non-ink, such as a varnish.

In one example after an image is printed on the substrate support 1304 the processor 1306 re-determines the topography of the substrate support 1304, for example by performing a new scan, and may determine a further image to be printed based on the re-determined topography and the desired topography.

When it is desired to remove printed ink from a substrate support, the printed and cured ink layer(s) may be peeled or scraped off the surface of the substrate support. Any debris that may block or restrict a vacuum channel may be removed by using a plunger, or a suitable tool. This operation may be assisted by operating the vacuum pump, resulting in any debris being removed by a vacuum pump filter.

The techniques and examples described herein provide numerous advantages. For example, being able to modify a substrate support in the manner described above less precisely manufactured (and hence cheaper) substrate supports to be quickly and cheaply modified to have a precise desired surface topography.

Another advantage is that modifications can be made to existing substrate supports, for example that may become deformed over time or through use. For example, by regularly determining the actual surface topography of a substrate support enable precise modifications to be applied to the support to ensure that the substrate support always has a desired surface topography.

A yet further advantage is that of enabling a 'general purpose' substrate support to be quickly and cheaply modifiable for a specific type of substrate have specific characteristics.

Furthermore, by ensuring a flat substrate support surface helps maintain a fixed printhead to substrate gap, and further helps reduce print quality issues.

Although the examples described above are made with reference to vacuum-based substrate supports, in other examples other types of substrate support may be used and modified in the same manner. For example, non-vacuum-based substrate supports may also be modified through printing to have a desired surface topography. In yet further examples any suitable object which may be printed on with a printing module may be may be modified in the manner described above to have a desired surface topography.

It will be appreciated that examples and embodiments of the present invention can be realized in the form of hardware, software or a combination of hardware and software. As described above, any such software may be stored in the form of volatile or non-volatile storage such as, for example, a storage device like a ROM, whether erasable or rewritable or not, or in the form of memory such as, for example, RAM, memory chips, device or integrated circuits or on an optically or magnetically readable medium such as, for example, a CD, DVD, magnetic disk or magnetic tape. It will be appreciated that the storage devices and storage media are examples of machine-readable storage that are suitable for storing a program or programs that, when executed, implement examples of the present invention. Examples of the present invention may be conveyed electronically via any medium such as a communication signal carried over a wired or wireless connection and examples suitably encompass the same.

All of the features disclosed in this specification (including any accompanying claims, abstract and drawings), and/or all of the steps of any method or process so disclosed, may be combined in any combination, except combinations where at least some of such features and/or steps are mutually exclusive.

Each feature disclosed in this specification (including any accompanying claims, abstract and drawings), may be replaced by alternative features serving the same, equivalent or similar purpose, unless expressly stated otherwise. Thus, unless expressly stated otherwise, each feature disclosed is one example only of a generic series of equivalent or similar features.

The invention claimed is:

1. A method of modifying a surface topography of a substrate support that is in fluid communication with a vacuum pump comprising:
   determining the surface topography of the substrate support comprising an arrangement of vacuum orifices;
   obtaining a desired surface topography of the substrate support and the arrangement or vacuum orifices;
   generating an image based on the determined surface topography and the desired surface topography; and
   printing the generated image on the substrate support to modify the topography of at least some of the vacuum orifices.

2. The method of claim 1, wherein the step of generating an image comprises generating multiple image and wherein the stop of printing further comprises successively printing and curing each generated image.

3. The method of claim 2, wherein the printed and cured fluid is removable.

4. The method of claim 1, wherein the stop of generating an image comprises generating multiple images and wherein the step of printing further comprises successively printing and curing each generated image.

5. The method of claim 4, wherein the step of printing comprises printing at least a portion of one of the multiple images on top of a previously printed and cured image.

6. The method of claim 1, wherein the step of printing causes at least some of the orifices to be blocked.

7. The method of claim 1, wherein the substrate support is a flat or drum shaped substrate support.

8. The method of claim 1, wherein the step of determining the surface topography of the substrate support comprises using an imaging module to obtain a three- dimensional topography of the substrate support surface.

\* \* \* \* \*

UNITED STATES PATENT AND TRADEMARK OFFICE
CERTIFICATE OF CORRECTION

PATENT NO.         : 9,533,499 B2
APPLICATION NO.    : 14/038041
DATED              : January 3, 2017
INVENTOR(S)        : Alex Davidson It is certified that error appears in the above-identified patent and that said Letters Patent is hereby corrected as shown below:

In the Claims

In Column 6, Line 62, in Claim 1, delete "or" and insert -- of --, therefor.

In Column 7, Line 7, in Claim 4, delete "stop" and insert -- step --, therefor.

Signed and Sealed this
Thirteenth Day of June, 2017

Joseph Matal
*Performing the Functions and Duties of the*
*Under Secretary of Commerce for Intellectual Property and*
*Director of the United States Patent and Trademark Office*